United States Patent

Brailove et al.

Patent Number: 5,828,070
Date of Patent: Oct. 27, 1998

[54] SYSTEM AND METHOD FOR COOLING WORKPIECES PROCESSED BY AN ION IMPLANTATION SYSTEM

[75] Inventors: Adam A. Brailove, Boston, Mass.; Peter H. Rose, Conway, N.H.; Julian G. Blake, Beverly Farms, Mass.; Zhongmin Yang, Boston, Mass.; Kenneth H. Purser, Lexington, Mass.

[73] Assignee: Eaton Corporation, Cleveland, Ohio

[21] Appl. No.: 756,972

[22] Filed: Nov. 26, 1996

Related U.S. Application Data

[63] Continuation-in-part of Ser. No. 601,983, Feb. 16, 1996, abandoned.

[51] Int. Cl.⁶ .............................. G01N 21/00; G21K 5/10
[52] U.S. Cl. ................................ 250/443.1; 250/442.11
[58] Field of Search ........................... 250/443.1, 442.11, 250/440.11, 492.21, 398

[56] References Cited

U.S. PATENT DOCUMENTS

| | | | |
|---|---|---|---|
| 3,954,191 | 5/1976 | Wittkower | 214/17 |
| 4,228,358 | 10/1980 | Ryding | 250/457 |
| 4,229,655 | 10/1980 | Ryding | 250/400 |
| 4,234,797 | 11/1980 | Ryding | 250/492 |
| 4,258,266 | 3/1981 | Robinson et al. | 250/492 |
| 4,261,762 | 4/1981 | King | 148/1.5 |
| 4,346,301 | 8/1982 | Robinson et al. | 250/492 |
| 4,433,951 | 2/1984 | Koch et al. | 414/217 |
| 4,517,465 | 5/1985 | Gault et al. | 250/492.2 |
| 4,542,298 | 9/1985 | Holden | 250/440.11 |
| 4,550,239 | 10/1985 | Uehara et al. | 219/121 |
| 4,553,069 | 11/1985 | Purser | 315/111.81 |
| 4,568,234 | 2/1986 | Lee et al. | 414/404 |
| 4,680,061 | 7/1987 | Lamont | 250/492.21 |
| 4,705,951 | 11/1987 | Layman et al. | 250/442.1 |
| 4,745,287 | 5/1988 | Turner | 250/492.2 |
| 4,766,313 | 8/1988 | Homma et al. | 250/443.1 |
| 4,836,733 | 6/1989 | Hertel et al. | 414/225 |
| 4,899,059 | 2/1990 | Freytsis et al. | 250/492.2 |
| 4,911,103 | 3/1990 | Davis et al. | 118/725 |
| 4,917,556 | 4/1990 | Stark et al. | 414/217 |
| 4,969,168 | 11/1990 | Sakamoto et al. | 250/440.11 |
| 5,177,878 | 1/1993 | Visser | 34/92 |
| 5,180,000 | 1/1993 | Wagner et al. | 269/21 |
| 5,203,958 | 4/1993 | Arai et al. | 156/643 |
| 5,229,615 | 7/1993 | Brune et al. | 250/492.2 |
| 5,308,989 | 5/1994 | Brubaker | 250/441.11 |
| 5,404,894 | 4/1995 | Shiraiwa | 134/66 |
| 5,478,195 | 12/1995 | Usami | 414/786 |
| 5,520,538 | 5/1996 | Muka | 432/205 |
| 5,564,682 | 10/1996 | Tsuji | 269/21 |
| 5,577,552 | 11/1996 | Ebinuma et al. | 250/443.1 |
| 5,588,827 | 12/1996 | Muka | 432/5 |

FOREIGN PATENT DOCUMENTS 0 463 853 A1  1/1992  European Pat. Off. .
39 43 482 A1  11/1990  Germany .

OTHER PUBLICATIONS

Patent Abstacts of Japan, vol. 017, No. 232 (C–1056), 12 May 1993 & JP 04363169 (Hitachi Ltd.), 16 Dec. 1992.
Patent Abstracts of Japan, vol. 095, No. 006, 31 Jul. 1995 & JP 07086342 (Hitachi Ltd.), 31 Mar. 1995.
Patent Abstracts of Japan, vol. 096, No. 001, 31 Jan. 1996 & JP 07235588 (Hitachi Ltd.), 5 Sep. 1995.

Primary Examiner—Bruce Anderson
Attorney, Agent, or Firm—Thomas J. Engellenner; Anthony A. Laurentano; Lahive & Cockfield, LLP

[57] ABSTRACT

A system and method for conductively and/or convectively transferring heat away from a workpiece that has been processed by a processing system, such as an ion implantation system. The conductive transfer of heat from the workpiece is effectuated by disposing the workpiece in relatively close proximity with a floor of a loadlock, which is maintained at a relatively cool temperature. The chamber pressure is disposed at a selected pressure by a pressure regulator and a vacuum pressure is applied to the backside of the workpiece closest to draw the workpiece into contact with the chamber floor, thereby effecting heat transfer from the workpiece to the cooling surface.

73 Claims, 5 Drawing Sheets

SYSTEM AND METHOD FOR COOLING WORKPIECES PROCESSED BY AN ION IMPLANTATION SYSTEM

REFERENCE TO RELATED APPLICATIONS

This application is a continuation-in-part application of Ser. No. 601,983, filed Feb. 16, 1996, entitled "Ion Implantation System For Flat Panel Displays" now abandoned, and is related to the commonly assigned application Ser. No. 08/757,726, filed Nov. 26, 1996, entitled "Control Mechanisms For Dosimetry Control In Ion Implantation Systems"; application Ser. No. 08/756,133, filed Nov. 26, 1996, entitled "Ion Implantation System For Implanting Workpieces"; and application Ser. No. 08/756,372, filed Nov. 26, 1996 entitled "Loadlock Assembly For An Ion Implantation System" now abandoned. The teachings of all the foregoing applications are incorporated herein by reference.

BACKGROUND OF THE INVENTION

The present invention relates to the processing of workpieces by processing systems such as ion implantation systems, and more particularly, to systems and methods for cooling workpieces processed by ion implantation systems.

Ion implantation has become a standard, commercially accepted technique for introducing conductivity-altering dopants into a workpiece, such as a semiconductor wafer or thin film deposition on a glass substrate, in a controlled and rapid manner. Conventional ion implantation systems include an ion source that ionizes a desired dopant element which is then accelerated to form an ion beam of prescribed energy. This beam is directed at the surface of the workpiece. Typically, the energetic ions of the ion beam penetrate into the bulk of the workpiece and are embedded into the crystalline lattice of the material to form a region of desired conductivity. This ion implantation process is typically performed in a high vacuum, gas-tight process chamber which encases a workpiece handling assembly, a workpiece support assembly, and the ion source. This high vacuum environment prevents dispersion of the ion beam by collisions with gas molecules and also minimizes the risk of contamination of the workpiece by airborne particulates.

The process chamber is typically coupled via a valve assembly with a processing end station. The end station can include an intermediate loadlock chamber or pressure lock which can be pumped down from atmospheric pressure by a vacuum pumping system. The chamber is selectively closed at a downstream by the valve assembly, which selectively places the chamber in fluid communication with the process chamber. The chamber is also coupled at an opposite end to an upstream valve assembly. The end station also includes an end effector which transfers workpieces from one or more workpiece cassettes, through the upstream valve assembly, and into the chamber. Once a workpiece has been loaded into the intermediate chamber by the end effector, the chamber is evacuated via the pumping system to a high vacuum condition compatible with the process chamber. The valve assembly at the downstream end of the intermediate chamber then opens and the workpiece handling assembly mounted within the process chamber removes the workpiece from the intermediate chamber and transfers the workpiece to the support assembly, which supports the workpiece during processing. For example, a loading arm of the workpiece handling assembly removes the workpiece from the intermediate chamber and places it on a platen of the workpiece support structure. The workpiece support then moves the workpiece in the scanning direction past the operating ion source, which implants the workpiece.

Today's burgeoning semiconductor and implantation technology has found widespread acceptance in the marketplace. With this acceptance has come demands for generating large quantities of implanted workpieces at competitive prices. A common goal of most modern implantation systems is to satisfy these demands by increasing the throughput of the system. Presently existing systems, however, are not well suited to meet these manufacturing and cost demands.

Modern high throughput ion implantation systems employ high energy ion sources which typically generate currents in excess of 1 mA and approaching 100 mA. The use of these ion sources creates intense heating of the workpiece, thereby producing an undesired rate of workpiece heating.

In many applications it is important to control the temperature of the workpiece during processing. Excessive heating of the workpiece can result in a number of undesirable side effects, such as excessive diffusion of dopants within the wafer, which can render the workpiece or portion thereof useless, and the outgassing and shrinkage of photoresist. These problems are exacerbated by the industries move towards ever shrinking line widths, which reduces the tolerance for undesired diffusion.

There currently exists several methods for controlling or reducing workpiece heating during processing. One conventional technique employs mechanical or electrostatic devices which clamp the workpiece to the platen of the workpiece support assembly mounted within the process chamber. The temperature of the workpiece is controlled by regulating the temperature of the platen. Unfortunately, at the microscopic level, the actual, physical workpiece to platen contact extends to only about 5% of the interface surface area between the two elements. Since the process chamber is typically maintained at a vacuum pressure state, e.g., extremely low pressure, heat conduction between the gas particles confined between the workpiece and platen are insufficient to effect timely and worthwhile heat exchange therebetween.

Another conventional technique used to improve the thermal conductivity between the workpiece and platen is to interpose between the workpiece and platen a thermally conductive, pliable material. This approach, however, suffers from problems associated with repeatedly cooling the workpiece in a reliable manner, the creation of thermal non-uniformities in the workpiece, and relatively burdensome and expensive maintenance.

Another conventional technique is to supply a cooling gas to the interface between the platen and the workpiece. The gas is typically supplied through cooling channels formed in the platen. The gas helps to convectively transfer heat from the workpiece to the platen. A problem associated with this approach is that the gas must be supplied within the processing chamber, which is maintained at a relatively "clean" environment. Further, appropriate gas conduits must be housed within the chamber, which function as additional sources of undesirable contamination.

Hence, there still exists a need in the art for improved systems and methods for cooling workpieces during processing. In particular, improved cooling methods that can increase the cooling rate in a repeatable and reliable manner would represent a major improvement in the art.

SUMMARY OF THE INVENTION

The present invention provides for a method and apparatus for transferring heat away from a workpiece that has been processed by a processing system, such as an ion implantation system. The present invention discloses several practices for transferring heat from the workpiece, including conductive heat transfer, convective heat transfer, and a combination of the two.

According to one practice, the conductive transfer of heat from the workpiece is effectuated by disposing the workpiece in relatively close proximity with a floor of a loadlock chamber, which is maintained at a relatively cool temperature. The chamber pressure is disposed at a selected pressure by a pressure regulator, e.g., a pump-down assembly, and a vacuum pressure is applied to the backside of the workpiece closest to the chamber floor to dispose the pressure of the gap formed between the workpiece and the chamber floor at a selected pressure, defined as the gap pressure. According to one practice, the difference in the two pressures is such that a downward force is applied to the workpiece that holds or clamps the workpiece to the floor to conductively transfer heat therebetween. The foregoing spatial and pressure arrangement promotes, according to this practice, a predominant conductive transfer of heat between the workpiece and the chamber floor, while avoiding the problems associated with cooling workpieces in high vacuum pressure environments. An advantage of this design is that it provides for a relatively simple cooling device that effectuates a relatively rapid cool down of the heated workpiece.

According to another practice, in addition to the foregoing conductive heat transfer arrangement, a cooling fluid can be directed either across the front surface of the workpiece, such that the flow of the cooling fluid is parallel to this surface, or normal to the front surface of the workpiece. This cooling arrangement promotes the convective transfer of heat away from the workpiece.

According to still another practice, the workpiece is supported within the chamber and a cooling fluid is directed against either the front surface, the back surface, or both. This cooling arrangement effectuates at least a predominantly convective transfer of heat away from the workpiece.

Accordingly, the apparatus of the present invention can include a housing, such as a loadlock chamber, having an internal chamber with a plurality of walls, where one of the walls forms a cooling surface, such as the chamber floor. The apparatus also includes a pressure or vacuum source that is coupled to the cooling surface for drawing the workpiece into relatively close proximity with the cooling surface and, thereby, effecting heat transfer from the workpiece to the cooling surface.

According to one aspect, the chamber pressure can be disposed at a selected pressure, such as by a pressure regulator, to control the pressure within the chamber so as to define a gap between the workpiece and the cooling surface that is sized to ensure that the heat transfer between the cooling surface and the workpiece is predominantly conductive. According to a preferred practice, the chamber pressure is disposed at an elevated level significantly above high vacuum pressure.

According to another aspect, the vacuum source applies a partial vacuum pressure to the backside of the workpiece (to draw the workpiece into close proximity with the chamber floor), e.g., through a manifold structure to maintain a predetermined vacuum force relative to the chamber pressure. This structure can include, according to another aspect, a duct network formed in the cooling surface and in communication with the vacuum source for disposing at least a substantial portion of the backside of the workpiece in close proximity with the cooling surface, thereby enhancing the uniformity and/or rate of cooling. According to one practice, the pressure network includes a plurality of transverse fluid grooves that are fluidly coupled with one another and with the vacuum source. The vacuum manifold structure can further include a vacuum measuring sensor (e.g., a manometer) and a vacuum regulator.

According to still another aspect, the workpiece and the cooling surface cooperate during cooling to form a gap therebetween as large as 1.3 mm, and preferably in the range between about 0.1 microns and about 5 microns, or even smaller. The pressure within the chamber can range between about 35 Torr and about 760 Torr, while the pressure within the gap will be lower, e.g., between about 20 Torr and about 745 Torr. The difference between the chamber pressure and the gap pressure defines the hold-down pressure, which applies a downward pressure to the workpiece to effectuate conductive heat transfer between the chamber floor and the workpiece. The hold-down pressure preferably is in the range between about 15 Torr and about 660 Torr.

According to yet another aspect, the gap is defined, at least in part, by the roughness of the workpiece and the chamber floor. Those of ordinary skill will realize that the smoother the surfaces the better the conductive transfer of heat when the two elements are placed in contact with each other. For example, either the workpiece or chamber floor has a roughness of less than about 5 $\mu$m, and the gap as a consequence has an overall size that is less than about 10 microns, and preferably less than about 5 microns.

In another aspect, the apparatus includes structure, which can be automatically controlled and operated by a controller, for varying one of the chamber pressure and the gap pressure to optimize conductive heat transfer from the workpiece.

In yet another aspect, the invention includes structure for circulating a cooling fluid through the loadlock chamber, and preferably through the cooling surface. This structure can include a fluid conduit enclosed within the chamber floor and sized to pass a cooling fluid therethrough, and which is coupled to a fluid source.

According to yet another aspect, the cooling surface can include a plurality of openings for passage of a mechanical lift assembly. The lift assembly can include a support bar and associated lifting structure, such as a threaded lead screw mounted at one end to the support bar, and a bearing concentrically disposed about the lead screw, for variably adjusting the position of the support bar within the chamber relative to the chamber floor. For example, the support bar can be disposed at a distal position where the bar and supported workpiece are disposed at a maximum vertical height, and at a proximal position where the workpiece is disposed at a position selective close to or on contact with the chamber floor, and any position in between. The operation of the mechanical lift assembly can be monitored and adjusted by the controller.

The loadlock can also include a convective cooling structure, such as an appropriately formed array of fluid ports, for directing a flow of cooling fluid at a front surface of the workpiece to convectively cool the workpiece. This flow of cooling fluid can be directed either generally parallel to one surface of the workpiece, such as the side opposite that side in contact with the chamber floor, or directed generally normal to one surface of the workpiece.

The present invention also provides for a method of cooling the workpiece, which includes the steps of (1) providing a housing having a chamber with a plurality of walls, one of the walls forming an inner cooling surface for cooling the workpiece, (2) positioning the workpiece within the chamber, (3) applying a partial vacuum pressure at the cooling surface to draw the workpiece into relatively close proximity with the cooling surface, and (4) cooling the workpiece to a selected temperature by the conductive transfer of heat between the cooling surface and the workpiece.

According to one aspect, the method also includes controlling the pressure within the chamber so as to define a gap between the workpiece and the cooling surface to ensure that the heat transfer therebetween is predominantly conductive. According to another aspect, the gap pressure is controlled or varied or maintained at a selected pressure state to create a net downward pressure force on the workpiece to clamp the workpiece in place to promote the conductive transfer of heat between the workpiece and the cooling surface.

According to another aspect, the invention includes placing the workpiece on a workpiece support assembly selectively disposable within the chamber either prior to or immediately after the step of positioning, and selectively alternately adjusting the support assembly between a raised position where the workpiece is disposed at a first distance distal from the cooling surface and a lowered position where the workpiece is placed proximal to the cooling surface, e.g., in contact therewith, to allow the conductive transfer of heat therebetween.

Other aspects of the invention include (1) circulating a cooling fluid within or over the loadlock chamber to form a cooling surface, (2) increasing one of the cooling rate and the cooling efficiency by controlling either the pressure within the chamber or the gap, (3) directing a flow of cooling fluid generally parallel to a front side of the workpiece and in close proximity thereto or normal to the front side to convectively cool the workpiece, (5) varying the pressure difference between the front side and backside of the workpiece, and (6) optimizing the cooling rate of the workpiece by varying the pressure difference between the front side and backside of the workpiece.

Other general and more specific objects of the invention will in part be obvious and will in part be evident from the drawings and description which follow.

BRIEF DESCRIPTION OF THE DRAWINGS

The foregoing and other objects, features and advantages of the invention will be apparent from the following description and apparent from the accompanying drawings, in which like reference characters refer to the same parts throughout the different views. The drawings illustrate principles of the invention and, although not to scale, show relative dimensions, unless otherwise indicated.

DESCRIPTION OF ILLUSTRATED EMBODIMENTS

Figure 1:
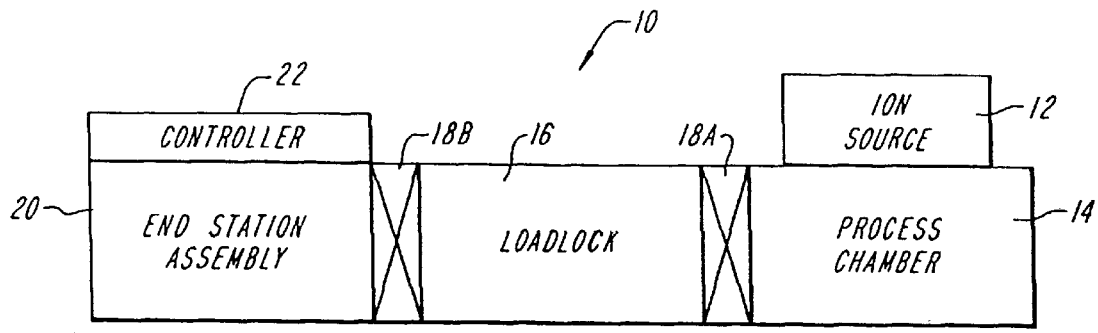
FIG. 1 is a schematic block diagram of an ion implantation system which employs the cooling system of the present invention.

FIG. 1 is a schematic block diagram of an ion implantation system for use with the present invention. The illustrated ion implantation system 10 includes an ion source 12 operatively coupled to a process chamber 14 of a process housing, which is in selective fluid communication with a loadlock 16 via a gate valve 18A. The loadlock 16 is also fluidly coupled to end station assembly 20 via gate valve 18B. Controller 22, which can be any data processing system, such as a general purpose computer or other processing mechanism, preferably controls one or more components or parameters of the illustrated ion implantation system 10. Hence, those of ordinary skill will readily recognize that the operation of one or more components of the ion implantation system can be selectively controlled by the controller in a manner known in the art.

The ion source 12, when operated, generates energetic ions which are accelerated to form an ion beam of prescribed energy. This beam is projected from the source 12 and into the process chamber 14, which selectively houses the workpiece. The workpiece is then exposed to the ion beam, which penetrates into the bulk of the workpiece to form a region of desired conductivity. The process chamber 14 is preferably maintained at a relatively high vacuum pressure condition, e.g., disposed at extremely low pressures in the range of about $7 \times 10^{-7}$ Torr.

The workpiece is loaded into the process chamber 14 according to known methods. For example, the end station assembly 20 can include one or more workpiece cassettes which house, in stacked form, a number of workpieces. An end effector is operatively coupled to the workpiece cassettes to transfer the workpiece to the loadlock 16. Prior to loading of the workpiece into the loadlock by the end effector, gate valve 18B is opened, and the workpiece is selectively positioned within the loadlock. The gate valve 18B is then closed and the loadlock is evacuated to a selected pressure, for example, at or near the vacuum pressure of the process chamber 14 or at some intermediate pressure. Once the loadlock 16 has been evacuated, gate valve 18A is opened and a workpiece transport assembly, which is typically mounted within the process chamber 14, removes the workpiece from the loadlock for processing within the process chamber. Conventional ion implantation systems for implanting workpieces are well known in the art, and exemplary systems are provided in the applications set forth in the Related Applications section, and need not be described further herein.

The illustrated controller 22 controls one or more components or parameters of the ion implantation system 10. According to one practice, the controller activates the end effector to initiate, according to a user-defined sequence, the loading of workpieces from the workpiece cassettes into the loadlock 16. The controller also selectively opens or closes the gate valve 18B to allow the insertion or withdrawal of a workpiece in the loadlock. Upon loading of the workpiece into the loadlock 16, the controller can activate the pumping assembly to selectively dispose the loadlock at or near a predetermined pressure. The controller 22 can also control one or more components of the workpiece transport assembly mounted within the process chamber 14, as described further below. Additionally, the controller 22 can selectively and alternately actuate the ion source 12 to initiate or arrest operation of the source.

Figure 2:
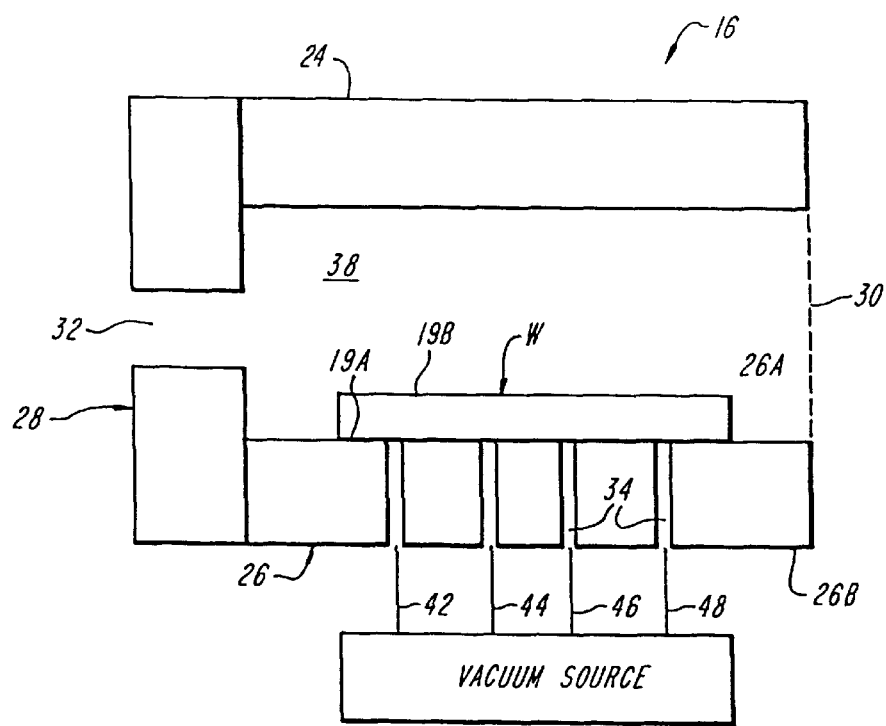
FIG. 2 is an exemplary cross-sectional view of the loadlock of FIG. 1 illustrating the application of a backside pressure to the workpiece to conductively transfer heat therefrom according to the teachings of the present invention.

FIG. 2 is a cross sectional view of the loadlock 16 and FIG. 1. The illustrated loadlock 16 preferably includes a top portion 24, an opposed bottom portion 26, and a plurality of sides including sides 28 and 30. Side 30 is shown in phantom to illustrate the existence of a gate valve, such as gate valve 18A or 18B, at either end of the loadlock 16. The opposing side 28, which can also mount a gate valve, is shown in solid to illustrate the slot 32 formed therein, as well as to show that the side portion is the same as side 30. The overall configuration of the loadlock is preferably the same as that shown and described in Attorney Docket Nos. ETE-010 and ETE-011, which were previously incorporated by reference.

The bottom portion 26 of the loadlock 16 preferably includes a number of fluid openings 34 which extend between the surface 26A, e.g., the chamber floor, and the outer surface 26B of the loadlock portion 26. The fluid openings 34 preferably open onto the floor 26A and thus into the internal chamber 38 of the loadlock 16. The fluid openings 34 are preferably connected to a vacuum source 40 by suitable fluid conduits, illustrated as fluid connections 42 through 48. The illustrated vacuum source 40 can be any suitable pressure source, such as a pump down assembly, which can apply a selected and variable level of vacuum pressure to the fluid openings 34 to draw the workpiece W against the floor 26A of the loadlock 16.

Although illustrated as four (4) fluid openings orthogonal to the floor 26A, the fluid openings can have any suitable size, shape or number, and can be arranged in any particular manner to apply a vacuum pressure to the backside of the workpiece. For example, a fluid network comprising a series of fluid openings, which connect with a fluid manifold and vacuum source 40, can be employed. The fluid manifold serves to disperse evenly the applied pressure from the vacuum source through the fluid openings to the backside of the workpiece W. An alternate embodiment of the fluid network is shown in FIG. 3, which employs a series of connecting grooves 60–66 arranged in the chamber floor shown, is described in further detail below.

Figure 3:
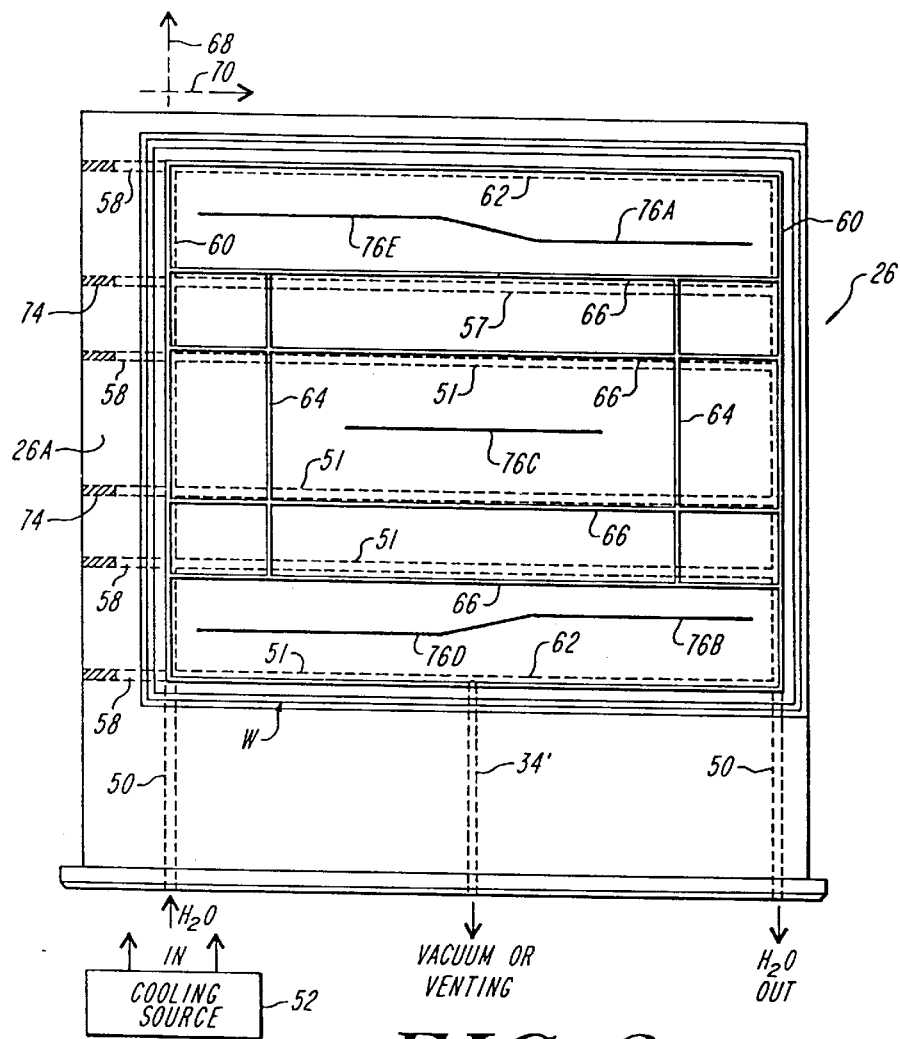
FIG. 3 is a top view of the floor of the loadlock chamber of FIG. 2 illustrating the pressure groove network and openings for a mechanical workpiece lift assembly according to the teachings of the present invention.

FIG. 3 is a top view of the chamber floor 26 of the loadlock 16. The illustrated loadlock surface 26A has a cooling network and a pressure network formed therein. The cooling network (shown in phantom) includes a number of cooling passageways 50 that are arranged, according to one embodiment, in a substantially criss-cross pattern to allow a cooling fluid, supplied by cooling source 52, to circulate therethrough. The cooling fluid introduced into the cooling input 54 is exhausted from the cooling network at output 56, and into an appropriate fluid reservoir. According to one practice, the cooling fluid output can be coupled to the cooling source to provide a recirculating flow of cooling fluid through the loadlock 16. According to one embodiment, the cooling fluid network includes a pair of oppositely arranged and parallel transverse cooling passages 50 that are bisected at appropriately spaced intervals by a series of orthogonal fluid passageways 51.

The cooling network can circulate any suitable cooling fluid, such as water or air, which is maintained at a temperature lower than the temperature of the heated workpiece prior to cooling.

The fluid network can further include extension passageways 58 transverse to either or both cooling passageways 50. the extension passageways allow cooling fluid to be introduced at a number of peripheral locations, thus relaxing the design constraints of the overall cooling system. When not in use, the extension passageways can be sealed with any suitable plug 74.

With further reference to FIG. 3, the vacuum fluid openings 34' can also be formed within the loadlock portion 26 in a direction generally parallel to the floor 26A, rather than vertically formed as shown in FIG. 2. These vacuum fluid openings, represented with like reference numbers plus a superscript prime, are initially formed within the loadlock portion 26A and open onto the floor 26A to form the vacuum pressure network, shown in solid line where it opens onto the floor 26A and in phantom to illustrate internal fluid passageways. According to a preferred embodiment, the vacuum pressure network includes a series of fluidly coupled vacuum grooves 60–66. The illustrated grooves include a first pair of vacuum grooves 60 which extend along the longitudinal axis 68 of the loadlock 26. A pair of orthogonal vacuum grooves 62 extend along an axis 70 orthogonal to the axis 68 and are fluidly coupled to and bisect the vacuum grooves 60. In combination, the vacuum grooves 60 and 62 form the outer boundaries of the vacuum network of the present invention. The illustrated vacuum grooves 60, 62 circumscribe or bound a second parallel pair of vacuum grooves 64 which are inwardly spaced from the grooves 60 and which extend along axis 68, but which are smaller in length than the outer vacuum grooves 60. These vacuum grooves 64 bisect a series of parallel and axially spaced apart vacuum grooves 66. The grooves 66 extend along axis 70 and are fluidly coupled to vacuum grooves 64 and 60, as shown. According to a preferred embodiment, the vacuum grooves have a width of about 0.06 inch and are preferably about 0.03 inch deep. The vacuum grooves are arranged to apply a sufficient level of pressure to draw nearly the entire workpiece W in relatively close proximity with the floor 26A of the loadlock 16.

The floor 26A of loadlock 16 further has formed therein a series of openings 76A–76E which seat components of a workpiece lifting assembly 80, as described in further detail below.

Those of ordinary skill will recognize that various changes and modifications can be made to the illustrated vacuum pressure and cooling fluid networks. For example, a different arrangement or number of grooves or channels can be employed to effectuate the functions set forth herein.

Specifically, various embodiments can be utilized to apply a cooling fluid through the loadlock 16, as well as to apply a pressure, such as a vacuum pressure, to the loadlock 16.

FIGS. 3 through 6 illustrate the workpiece lifting assembly 80 of the present invention. The illustrated workpiece lifting assembly 80 includes components which are within each lifting assembly opening 76A–76E formed in the floor 26A of the loadlock. According to a preferred embodiment, the lifting assembly openings 76A–76E are positioned to provide a staggered array of openings. For example, with reference to FIG. 4, a first upper lifting assembly opening 76E (located at the top most part of the page) extends along axis 70, and a second parallel, offset opening 76A is positioned towards the front (bottom part of the page) of the loadlock. Similarly, the loadlock includes a bottom most opening 76D which extends along axis 70, and a second parallel opening, which is offset in a direction along axis 68. A central lift assembly opening 76C is formed between the vacuum openings 66 and also extends along axis 70. According to a preferred embodiment, the workpiece lifting assembly 80 includes a plurality of individual lifting members which are mounted in each of the lift assembly openings 76A–76E. Since the construction of each lifting member of the assembly 80 is the same, only the description of a single lifting assembly and its associated operation need be described below, and is intended to be representative of the operation and structure of each of the lifting members.

Figure 4:
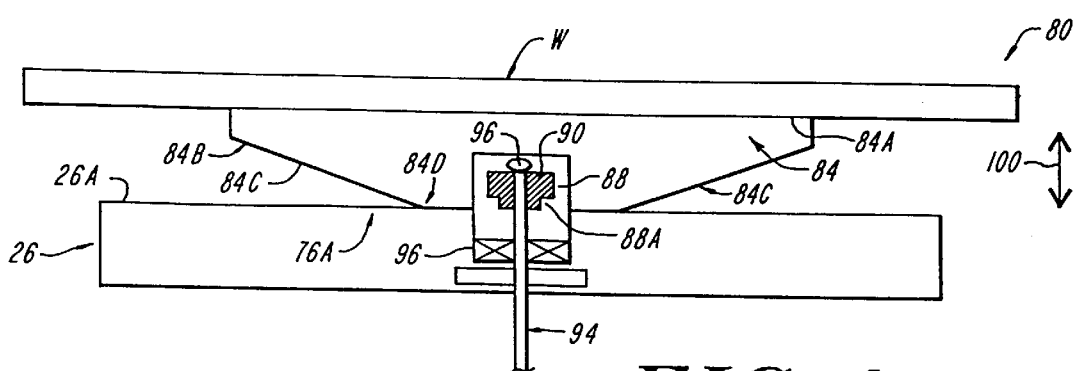
FIG. 4 is an illustrative cross-sectional view of the loadlock and the mechanical lift assembly of the present invention.
Figure 5:
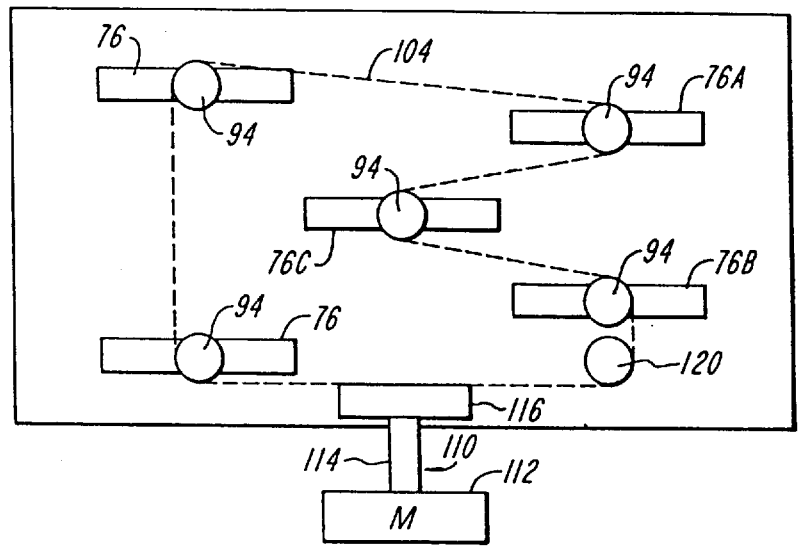
FIG. 5 is an illustrative bottom view of the loadlock of FIG. 2 further illustrating the mechanical lift assembly of FIG. 5.

The illustrated workpiece lift assembly 80 includes a plurality, e.g., five, individual lifters or support arms 84, each of which is mounted within a corresponding opening 76A–76E and are operatively coupled to each other, as described further below. With further reference to FIG. 4, each support arm 84 has a substantially flat top surface 84A and a substantially tapered bottom portion 84B that includes a pair of sloping bottom walls 84C which converge to form a substantially flat bottom most portion 84D substantially parallel to the top surface 84A. A support bracket 88 is mounted within an appropriate groove formed in the bottom portion 84D of the support arm. The support bracket 88 has a substantially C-shaped configuration and includes a pair of lip portions 88A which are disposed opposite to each other and which extend inwardly towards a center portion of the bracket-mounting groove. The C shaped configuration of the mounting bracket 88 has a hollow central portion which seats a bushing 90. A lead screw 94 is mounted within a correspondingly formed passage way which extends through the loadlock between the bottom and top surfaces 26A, 26B. Further, the lead screw 94 is mounted within a correspondingly formed mounting aperture formed within the bushing 90 and the mounting bracket 88, as illustrated. One or more bearings 96 are concentrically disposed about the lead screw 94. The lead screw terminates, according to one practice, at a second bushing 96.

FIG. 4 illustrates the lifting assembly disposed in an upper-most or deployed position where the support arm 84 is maximally extended within the chamber 38 and at a position distal from the chamber floor 26A. The support arm 84, when retracted, is lowered in a direction illustrated by the arrow 100 such that it descends into the corresponding lifting assembly opening, e.g., opening 76A, such that the top surface 84A is at a height relative to the opening substantially even with the chamber floor, or in an alternate embodiment, is depressed within the opening 76.

Those of ordinary skill will recognize that each lifting assembly opening 76A–76E mounts a component package which are all operatively coupled together. The support arm 84 can be variably positioned at a selected vertical height, as indicated by arrow 100, by operation of the lead screw 94. As particularly shown in FIG. 6, which is a bottom view of the bottom surface 26B of the loadlock 16, the lead screw 94 extends from the bottom loadlock surface 26B, or at least are accessible from a bottom portion of the loadlock, and mate with a tread belt 104, indicated by dashed lines. The tread belt is operatively coupled to a motor assembly 110 having a motor 112 coupled to a rotary shaft 114, which terminates in an appropriate mechanism 116 to interface with the tread belt 104. By actuating the motor 112, the rotary shaft 114 rotates, and this rotary motion is transformed into a reciprocal actuating motion by the facing mechanism 116, to move the tread belt in a selected direction. To keep the tread belt 104 taut and thus to enhance operation of the workpiece lift assembly, one or more secondary rollers 120 can be provided. Movement of the tread belt 104 rotates the lead screw 94 in a first direction to raise the support arm and thus the workpiece in a vertical direction, or conversely moves the lead screw in an opposite rotational direction to move the support arm vertically downwardly towards the chamber floor 26A.

Figure 6A:
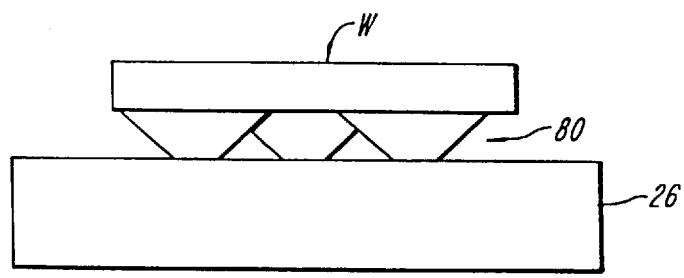
FIG. 6 is an exemplary depiction of the vertical movement of the workpiece within the loadlock chamber of FIG. 2 by the mechanical lift assembly according to the teachings of the present invention.
Figure 6B:
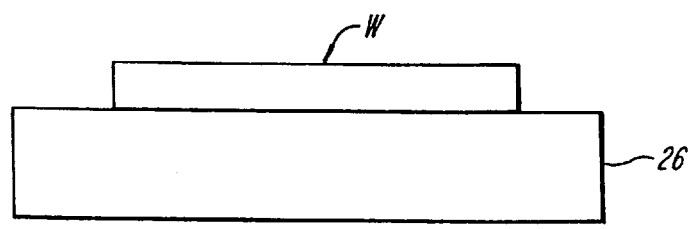

FIG. 6 is a schematic illustration of the vertical movement of the workpiece W between a first uppermost position A and a vertically downwardly second position B by the lifting assembly 80 of the present invention.

The present invention provides for a fluid cooling system that transfers heat away from the workpiece W. According to the embodiment shown in FIGS. 1–6, heat is conductively transferred between the workpiece W and the relatively cool floor 26A of the loadlock 16. According to one practice, the workpiece lift assembly 80 is variably positioned to place a bottom portion 19A of the workpiece W in relatively close proximity with the floor 26A of the loadlock chamber 38. The term "relatively close proximity" is intended to mean placing the workpiece bottom 19A in a position relative to the floor 26A of the bottom portion 26 of the loadlock 16 to promote, enhance or effectuate conductive heat transfer between the workpiece W and the loadlock 16. This term is intended to include the direct contact of the workpiece W with the loadlock 16, as well as includes some separation between the workpiece bottom 19A and the floor 26A of the loadlock. This separation is at a distance selected to promote the predominant conductive transfer of heat between the workpiece and the loadlock. The term "predominantly" is intended to mean that the transfer of heat is more likely than not a conductive transfer of heat from the workpiece. For example, the gap or separation between the workpiece and the loadlock surface should be comparable to the mean free path so that collisions between the gas molecules are not more frequent than collisions with one of the surfaces of the workpiece and the loadlock. Those of ordinary skill will readily recognize that the mean free path of the fluid within the gap is a function of gap pressures and molecular diameter. Furthermore, those of ordinary skill, knowing the roughness of the workpiece and the floor 26A of the loadlock, as well as knowing the chamber pressure and the gap pressure ( as measured by a manometer placed between the workpiece and the loadlock floor) can readily determine the appropriate range of gap sizes to effectuate a predominant conductive transfer of heat between the workpiece and the loadlock. For example, if the gap pressure is disposed at 10 Torr the mean free path for water vapor is about $1 \times 10^{-4}$ mm.

According to one practice, the pressure of the chamber 38 can be variably controlled by a pressure regulator, which forms part of known pump down assemblies. The chamber pressure is preferably varied in the range between about 35

Torr and about 760 Torr, and more preferably between about 120 Torr and about 760 Torr. The vacuum source, FIG. 2, preferably disposes the gap pressure, as measured by a manometer disposed between the workpiece and the loadlock, in the range between about 20 Torr and about 745 Torr, and more preferably between about 50 Torr and about 700 Torr.

Figure 7A:
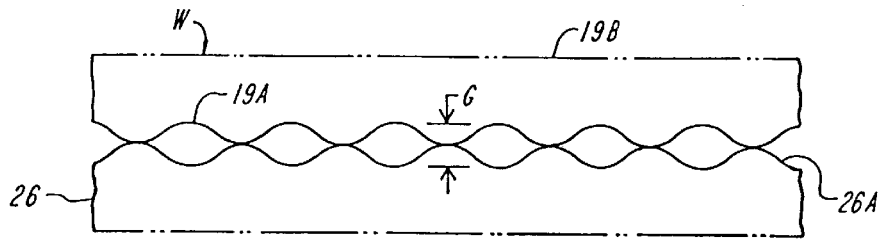
FIG. 7A is a microscopic cross-sectional view of the loadlock and workpiece illustrating the contact area between the workpiece and the chamber floor and the gap formed therebetween.

The gap formed between the workpiece and the floor 26A of the loadlock is shown, at a microscopic level, in FIG. 7A. The surface roughness of the workpiece W and of the loadlock portion 26 defines the average gap distance G between the two surfaces. This gap distance is less than about 100 microns, preferably less than 10 microns, more preferably less than 5 microns, and most preferably less than 1 micron. A person of ordinary skill will readily recognize that the smaller the gap the better the cooling of the workpiece. For example, the cooling rate of the workpiece improves as the gap pressure increases, until a point where the gas mean free path is about one tenth of the average gap distance. Hence, a smoother surface increases the cooling efficiency of the illustrated system 10 by effectively using the higher backside gap pressure. Other concerns dictate, however, what the actual surface roughness of either the workpiece or the cooling surface will be, including the cost associated with providing highly finished surfaces.

In operation, the end effector of the end station assembly 20 removes a workpiece, such as a flat panel display, from a panel cassette. The controller 22 then opens gate valve 18B such that the end effector can position the panel within the loadlock 16. According to one practice, the workpiece lift assembly is disposed in its uppermost vertical position A, such that the end effector can load the panel into the loadlock 16 in a relatively easy and efficient manner. Once the panel is loaded in loadlock 16, the controller closes valve 18B, and then via a pump down assembly, evacuates the loadlock 16 to a pressure compatible with or near the vacuum pressure of the process chamber 14. Upon reaching this selected pressure state, the controller opens valve 18A, and the workpiece transport assembly mounted within the process chamber 14 removes the panel from the loadlock 16 and exposes it to the ion beam generated by the ion source. This exposure to the ion beam heats the panel.

Once the panel is implanted by the ion source, the workpiece transfer assembly places the panel, which has been heated to a selected elevated temperature by the ion beam, into the loadlock 16. The controller 22 closes valve 18A and the loadlock chamber is vented to a selected elevated pressure.

Once the panel has been positioned within the loadlock 16, and preferably positioned on the workpiece lift assembly when disposed in its deployed position, the panel is cooled. The panel cooling occurs by actuating the workpiece lifting assembly 80, such as by a control signal generated by controller 22, such that the panel is lowered or moved vertically downward towards the chamber floor 26A. When the panel is positioned at a selected position relative to the chamber floor, and preferably disposed in contact therewith, the controller actuates the vacuum source 80 which disposes the gap at a selected gap pressure sufficient to draw the workpiece against the chamber floor and disposes the chamber at a selected pressure. Preferably, the chamber pressure and gap pressure are selected such that the difference therebetween, defined as the hold down pressure, clamps the panel in a selected position, to allow the conductive transfer of heat between the workpiece and the loadlock 16. As described above, the loadlock has a cooling fluid that is circulated therethrough to dispose the loadlock floor at a selected cooling temperature. By establishing the gap size (determined in part by the finished surfaces of the workpiece and the chamber floor) and the hold down pressure, the cooling rate of the panel and hence the cooling efficiency of the ion implantation system can be optimized such that the panel is cooled in a relatively short period of time.

Figure 7B:
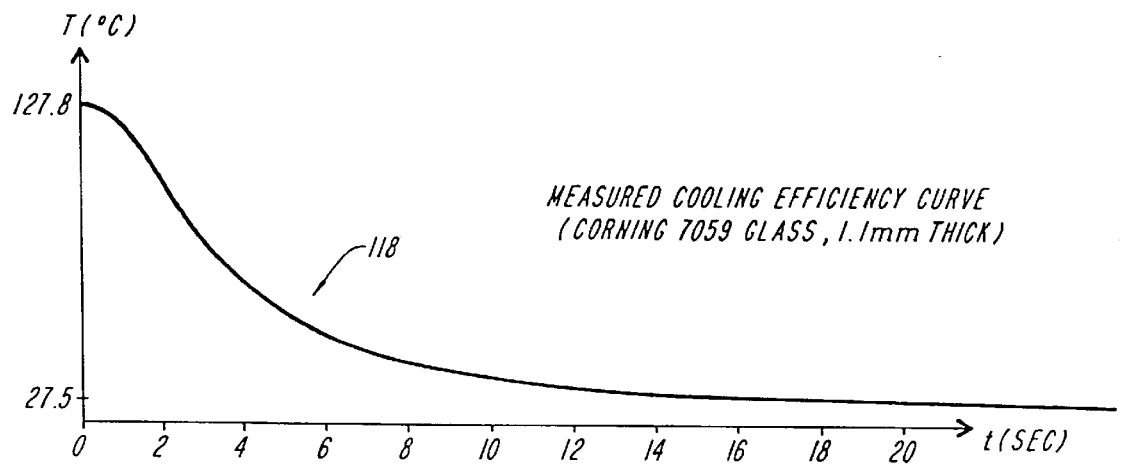
FIG. 7B is a cooling efficiency curve graphically illustrating the cooling efficiency of 1.1 mm thick Corning 705G glass substrate that is cooled in accordance with the teachings of the present invention.

FIG. 7B is a cooling efficiency curve graphically illustrating the cooling rate of a workpiece when conductively cooled according to the teachings of the present invention. The illustrated graph 118 denotes temperature in degrees Celsius along the ordinate axis, and denotes time in seconds along the abscissa. As shown, a flat glass panel display, such as Corning 705G glass which is 1.1 mm thick, can be cooled from an implanted temperature of about 120° C. to 30° C. in about 10 seconds.

A significant advantage of the cooling system of the invention is that it provides for an ion implantation system that incorporates a cooling mechanism for quickly and efficiently cooling an implanted workpiece. Another significant advantage is that it improves the overall handling and cooling time of the flat panel, thus increasing the throughput of the ion implantation system. Another significant advantage of the cooling system is that cooling can occur at a chamber pressure significantly above those pressures typically associated with high vacuum environments, typically at pressures significantly above $1 \times 10^{-7}$ Torr.

When the panel has been cooled to a selected user-defined temperature, the panel can be retrieved by the workpiece handling assembly mounted within the process chamber for further processing, or can be removed from the loadlock by the end effector.

Figure 8:
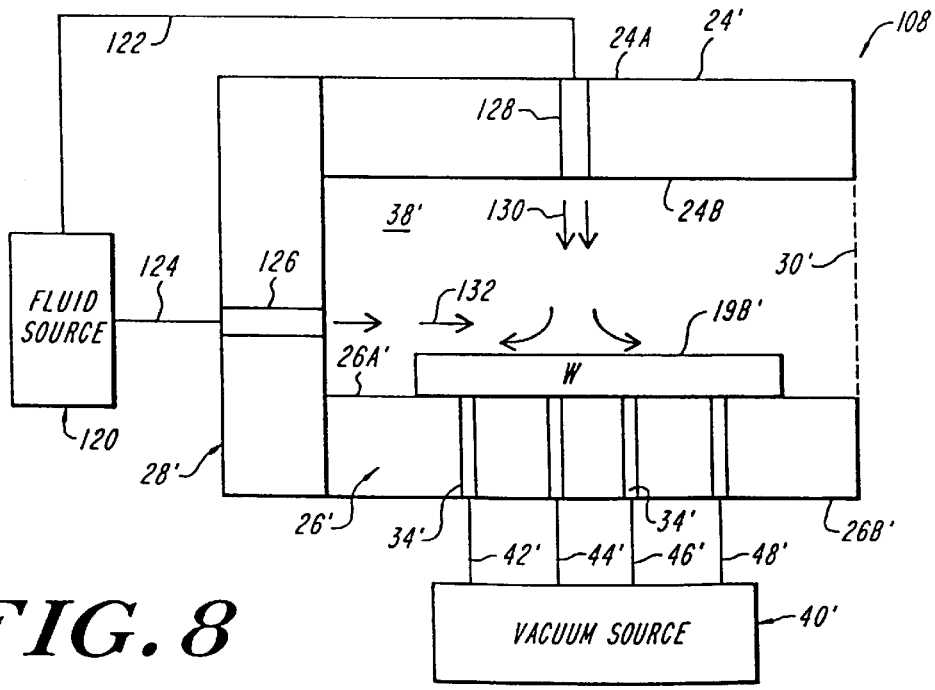
FIG. 8 is an exemplary cross-sectional view of the loadlock of FIG. 1 illustrating the application of a backside pressure to the workpiece and the application of a flow of cooling fluid either normal or parallel to the workpiece to conductively and convectively cool the workpiece according to the teachings of the present invention.

FIG. 8 is a cross-sectional depiction of another embodiment of the cooling system 108 of the present invention. Like reference numerals are used throughout the views to designate like parts plus a superscript prime. The illustrated cooling system is similar to that shown and described in relation to FIG. 2, and thus like elements need not be again explained in detail.

The illustrated cooling system 108 includes a fluid source 120 coupled by fluid conduits 122 and 124 to one or more fluid ports, e.g., fluid port 126 or fluid port 128, which are formed in selected walls of the loadlock chamber 38'. For example, fluid port 128 is formed in the loadlock portion 24° and fluid port 126 is formed in loadlock portion 28'. Fluid port 126 is shown formed in loadlock wall 28' for illustration purposes, and according to a preferred embodiment, the fluid port 126 can be formed in one of the other vertically extending walls. The fluid source can be selectively coupled to either or both of the fluid ports. If the fluid source 120 is fluidly coupled via fluid conduit 122 to fluid port 128, the fluid source can discharge a cooling fluid through the port 128 in a vertically downward direction towards the workpiece W when positioned within the chamber 38'. According to one practice, the workpiece W is positioned within the chamber 38' such that the fluid port 128 is located at a generally central position relative to the workpiece. The fluid source 120 introduces a cooling fluid to the fluid port 128, which directs the flow towards the front surface 19B' of the workpiece W. The flow of cooling fluid from the port 128 is illustratively shown by arrows 130. By positioning the workpiece such that the port 128 directs a cooling fluid to a central region thereof, the cooling fluid, which impacts the workpiece top surface 19B' at a generally normal direction, flows outwardly from the central region to the edges of the workpiece. This provides for a substantially uniform convective cooling of the entire workpiece.

According to another practice, the fluid source can supply a cooling fluid via fluid conduit 124 to port 126 formed in a wall of the chamber. For illustration purposes only, the port 126 is formed in loadlock portion 28' of the loadlock. In this embodiment, the fluid port 126 directs the fluid supplied by the fluid source 120 in a direction generally parallel and close to the front surface 19B' of the workpiece W. The use of the cooling system 108 to convectively cool the workpiece in addition to the conductive heat transfer or cooling system also illustrated provides for a dual convective, conductive cooling system for transferring heat from the workpiece. A significant advantage of this dual cooling embodiment is that it ensures rapid cooling of the workpiece, while concomitantly effectuating a generally conductive exchange of heat between the workpiece and the surrounding environment.

Figure 9:
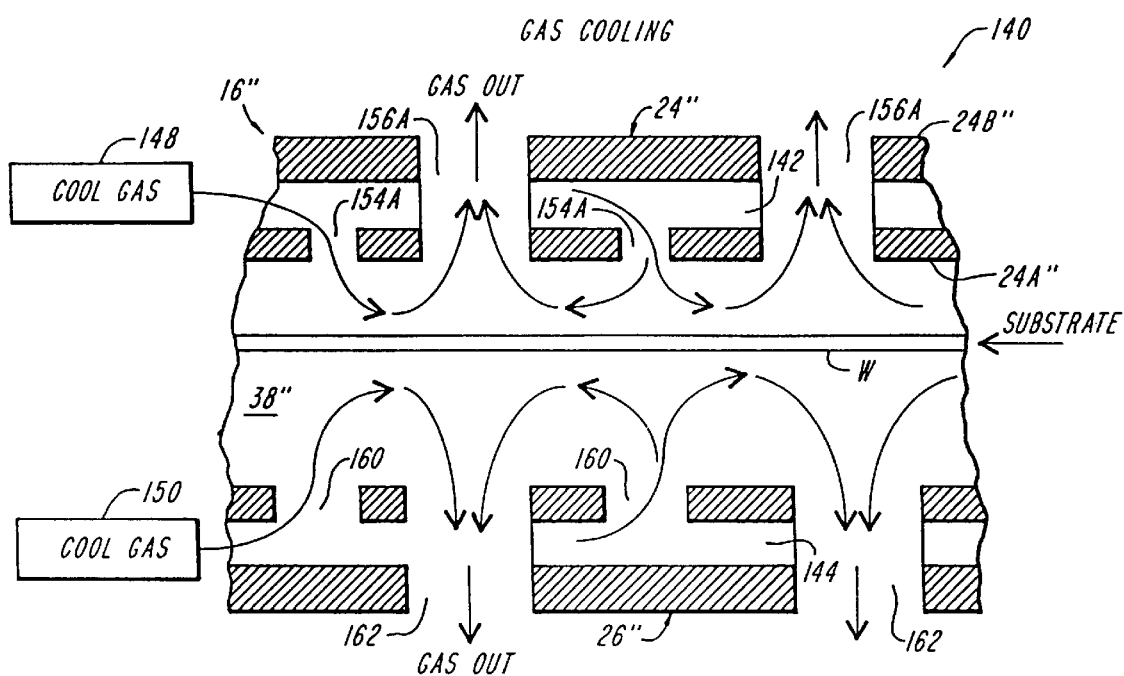
FIG. 9 is an exemplary cross-sectional view of the loadlock of FIG. 1 illustrating the application of a flow of cooling fluid to the workpiece to convectively transfer heat therefrom according to the teachings of the present invention.
Figure 10:
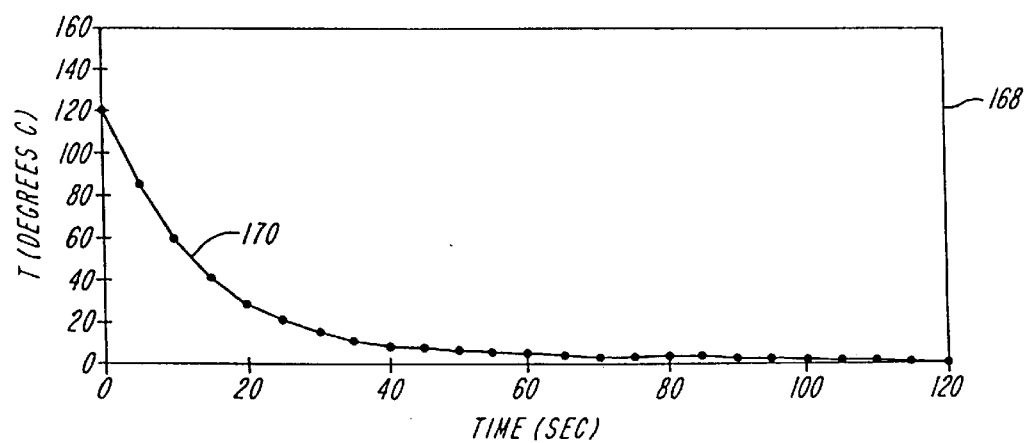
FIG. 10 is a cooling efficiency curve graphically illustrating the cooling efficiency of the system of FIG. 9 when employed to convectively cool the workpiece in accordance with the teachings of the present invention.

FIGS. 9 and 10 illustrate still another embodiment of the cooling system of the present invention. Like parts are designated with like reference numbers plus a double script prime. The illustrated cooling system 140 employs a purely convective cooling system 140 for cooling the workpiece W. This partially broken away view of the loadlock 16" illustrates one system for convectively cooling the workpiece W. Those of ordinary skill will recognize that other embodiments exist which could direct one or more streams of cooling fluid to the workpiece W to convectively transfer heat therefrom.

The illustrated loadlock 16" includes a fluid manifold 142 that is formed in loadlock portion 24" and a fluid manifold 144 formed in loadlock portion 26". The manifolds 142, 144 are respectively coupled to a source of cooling fluid, such as cooling gas source 148 and 150. The cooling gas sources 148, 150 supply via suitable fluid conduits a cooling fluid to each respective manifold. Appropriate fluid passages, for example, fluid passages 154A are formed within the roof of the chamber and fluidly couple the manifold 142 with the chamber 38". Exit fluid passageways 156A are formed between the chamber roof of the bottom portion 24A" of the loadlock and, for example, the outer surface 24B" of the loadlock. The exit fluid passageways 156A allow the cooling gas introduced through the fluid openings to exit the chamber. The fluid manifold 142 evenly disperses the cooling fluid supplied by the cooling gas source 148 through the loadlock portion 24". The fluid openings 154A direct the pressurized cooling fluid from the manifold 142 into the chamber 38" and against the workpiece W. The cooling gas thus serves to convectively transfer heat from the workpiece W to the cooling gas, which is then discharged from the chamber 38", to cool the workpiece.

Similarly, the loadlock portion 26" can have a fluid manifold 144 formed therein. A series of fluid openings 160 fluidly couple the manifold 144 with the chamber 38". A number of exit fluid passageways 162 are formed in the loadlock portion 26". As described above, the cooling gas source 150 introduces a supply of pressurized cooling fluid to the manifold 144, which is then dispersed through the fluid openings 160 into the chamber 38". This pressurized cooling fluid is directed towards the workpiece W and serves to convectively transfer heat therefrom. The heated cooling fluid is then discharged through the exit fluid passageways 162 and from the loadlock chamber 38".

The workpiece W can be supported within the loadlock chamber 38" by any suitable mechanism, such as the workpiece lift assembly 80 previously described, as well as any other conventional workpiece support assembly, such as pin support-type assemblies.

FIG. 10 is a cooling curve graphically illustrating the cooling rate of a workpiece W when cooled convectively by a cooling fluid supplied by one or more of the cooling gas sources 148, 150. The graph 168 denotes temperature in degrees Celsius along the ordinate axis and denotes time in seconds along the abscissa. The cooling curve 170 illustrates that a workpiece W heated to 120° C., for example, can be convectively cooled according to the teachings of the present invention to approximately 30° in thirty seconds. This convective cooling rate is similar to the cooling rate achieve by the conductive cooling system described in relation to FIGS. 1 through 6.

According to yet another embodiment, the cooling fluid can be directed substantially parallel to either the top and/or bottom surfaces of the workpiece W. This can be achieved by the formation an appropriate fluid manifold or fluid port within an appropriate respective wall of the loadlock chamber. Illustratively, a workpiece W heated to approximately 120° C. by the ion implantation system, can be cooled to about 30° C. in approximately 40 seconds.

It will thus be seen that the invention efficiently attains the objects set forth above, among those made apparent from the preceding description. Since certain changes may be made in the above constructions without departing from the scope of the invention, it is intended that all matter contained in the above description or shown in the accompanying drawings be interpreted as illustrative and not in a limiting sense.

It is also to be understood that the following claims are to cover all generic and specific features of the invention described herein, and all statements of the scope of the invention which, as a matter of language, might be said to fall there between.

Having described the invention, what is claimed as new and desired to be secured by Letters Patent is:

1. An apparatus for cooling a workpiece, comprising
   a loadlock housing having an internal chamber with a plurality of walls, one of the walls forming an inner cooling surface; and
   vacuum means coupled to the cooling surface for drawing the workpiece into relatively close proximity with the cooling surface and, thereby, effecting heat transfer from the workpiece to the cooling surface.

2. An apparatus in accordance with claim 1, further comprising a pressure regulator to control the pressure within the chamber so as to define a gap between the workpiece and the cooling surface to ensure that the heat transfer between the cooling surface and the workpiece is predominantly conductive.

3. An apparatus in accordance with claim 2, wherein the pressure regulator disposes the chamber at a selected pressure between about 35 Torr and about 760 Torr.

4. An apparatus in accordance with claim 2, wherein the pressure regulator when operated in conjunction with the vacuum means increases one of the cooling rate and cooling efficiency.

5. An apparatus in accordance with claim 1, further comprising a plurality of vacuum-applying openings formed in the cooling surface and in communication with the vacuum means for disposing a substantial portion of the backside of the workpiece in contact with the cooling surface, thereby enhancing the uniformity and rate of cooling.

6. An apparatus in accordance with claim 1, wherein the cooling surface and the workpiece define a gap therebetween when contacting each other, the gap having a size in the range between about 0.1 microns and about 5 microns.

7. An apparatus in accordance with claim 6, wherein the cooling surface and the workpiece each have a surface roughness which define the gap.

8. An apparatus in accordance with claim 8, wherein the internal chamber has a pressure between about 35 Torr and about 760 Torr.

9. An apparatus in accordance with claim 8, wherein the vacuum means creates a pressure within the gap beneath the workpiece that draws the workpiece against the cooling surface, the gap pressure being in the range between about 20 Torr and about 745 Torr.

10. An apparatus in accordance with claim 9, further comprising means for varying the chamber pressure and the gap pressure such that the difference therebetween is between about 15 Torr and about 660 Torr.

11. An apparatus in accordance with claim 10, wherein the pressure difference is between about 50 Torr and about 660 Torr.

12. An apparatus in accordance with claim 9, wherein the gap pressure is between about 70 Torr and about 760 Torr.

13. An apparatus in accordance with claim 9, wherein the gap has a size between about 0.1 microns and about 5 microns sufficient to allow the conductive transfer of heat between the workpiece and the cooling surface, the gap size being a function of one of the chamber pressure and the gap pressure.

14. An apparatus in accordance with claim 8, wherein the chamber pressure is in the range between about 120 Torr and about 760 Torr.

15. An apparatus in accordance with claim 1, wherein the cooling surface has a surface roughness of less than about 5 $\mu$m.

16. An apparatus in accordance with claim 1, wherein the chamber has a selected pressure and the vacuum means creates a pressure within a gap formed between the workpiece and cooling surface when the workpiece is disposed in close proximity therewith, further comprising means for varying one of the chamber pressure and the gap pressure to optimize conductive heat transfer therebetween when the gap is between about 0.1 microns and 5 microns.

17. An apparatus in accordance with claim 1, further comprising means for circulating a cooling fluid through the cooling surface.

18. An apparatus in accordance with claim 1, wherein the cooling surface encloses a fluid conduit sized to circulate a cooling fluid therethrough, the fluid conduit being adapted to couple with a cooling fluid source.

19. An apparatus in accordance with claim 1, wherein the vacuum means includes a fluid network formed in the cooling surface for applying a pressure to the backside of the workpiece.

20. An apparatus in accordance with claim 19, wherein the fluid network includes a plurality of transverse fluid grooves that are fluidly coupled with one another and with a vacuum source.

21. An apparatus in accordance with claim 1, wherein the cooling surface includes a plurality of openings for allowing passage of a mechanical lift assembly.

22. An apparatus in accordance with claim 21, wherein the mechanical lift assembly includes a support bar and means for variably adjusting the position of the support bar within the chamber.

23. An apparatus in accordance with claim 22, wherein the means for adjusting includes a threaded lift screw mounted at one end to the support bar, and a bearing concentrically disposed about the lift screw.

24. An apparatus in accordance with claim 21, further comprising a controller for automatically controlling the mechanical lift assembly.

25. An apparatus in accordance with claim 1, further comprising a controller for automatically controlling pressure within the chamber and the pressure applied to the workpiece by the vacuum means.

26. An apparatus in accordance with claim 1, further comprising means for providing a flow of cooling fluid directed generally parallel to a front side of the workpiece and in close proximity thereto to convectively cool the workpiece.

27. An apparatus in accordance with claim 1, further comprising means for providing a flow of cooling fluid generally transverse to a front side of the workpiece to convectively cool the workpiece.

28. An apparatus in accordance with claim 1, further comprising means for providing a flow of cooling fluid generally normal to a front side of the workpiece to convectively cool the workpiece.

29. An apparatus in accordance with claim 28, further comprising means for positioning the workpiece such that the flow of cooling fluid is generally normal to a central region of the workpiece.

30. An apparatus in accordance with claim 1, wherein the housing is a loadlock of an ion implantation system and the cooling surface is a floor of the loadlock chamber.

31. An apparatus in accordance with claim 1, wherein the vacuum means includes a plurality of vacuum openings formed in the cooling surface, and a vacuum source coupled to the openings for applying a vacuum to the workpiece.

32. An apparatus in accordance with claim 1, further comprising means for disposing the chamber at a pressure significantly above vacuum.

33. A method in accordance with claim 1, further comprising the step of directing a flow of cooling fluid generally normal to a front side of the workpiece to convectively cool the workpiece.

34. A method in accordance with claim 1, wherein the chamber has a selected pressure and the vacuum means creates a pressure within a gap formed between the workpiece and cooling surface when the workpiece is disposed in close proximity therewith, further comprising the step of varying one of the chamber pressure and the gap pressure to optimize conductive heat transfer therebetween when the gap is between about 0.1 microns and 5 microns.

35. A method for cooling a workpiece, comprising
providing a loadlock housing having a loadlock chamber with a plurality of walls, one of the walls forming an inner cooling surface for cooling the workpiece,
positioning the workpiece within the loadlock chamber,
applying a partial vacuum pressure from the cooling surface to draw the workpiece into relatively close proximity with the cooling surface, and
cooling the workpiece to a selected temperature by the conductive transfer of heat between the cooling surface and the workpiece.

36. A method in accordance with claim 35, further comprising the step of controlling the pressure within the chamber so as to define a gap between the workpiece and the cooling surface to ensure that the heat transfer therebetween is predominantly conductive.

37. A method in accordance with claim 36, further comprising the step of increasing one of the cooling rate and cooling efficiency by one of controlling the pressure within the chamber and applying a partial vacuum.

38. A method in accordance with claim 36, wherein the cooling surface and the workpiece each have a surface roughness which define the gap.

39. A method in accordance with claim 35, further comprising the step of placing the workpiece on a workpiece support assembly disposed within the chamber either prior to or immediately after the step of positioning.

40. A method in accordance with claim 39, further comprising the step of selectively alternately adjusting the support assembly between a raised position where the workpiece is disposed at a first distance distal from the cooling surface and a lowered position where the workpiece is placed proximal to the cooling surface to allow the conductive transfer of heat therebetween.

41. A method in accordance with claim 35, further comprising the step of circulating a cooling fluid through the cooling surface of the housing.

42. A method in accordance with claim 35, further comprising the step of forming a fluid conduit sized to circulate a cooling fluid therethrough in the cooling surface, the fluid conduit being adapted to couple with a cooling fluid source.

43. A method in accordance with claim 35, further comprising the step of forming a fluid network in the cooling surface for applying a pressure to the backside of the workpiece.

44. A method in accordance with claim 35, further comprising the step of automatically controlling one of the pressure within the chamber and the pressure applied to the workpiece from the cooling surface.

45. A method in accordance with claim 35, further comprising the step of directing a flow of cooling fluid generally parallel to a front side of the workpiece and in close proximity thereto to convectively cool the workpiece.

46. A method in accordance with claim 35, further comprising the step of directing a flow of cooling fluid generally transverse to a front side of the workpiece to convectively cool the workpiece.

47. A method in accordance with claim 35, wherein the housing is a loadlock of an ion implantation system and the cooling surface is a floor of the loadlock chamber.

48. A method in accordance with claim 35, further comprising the steps of
introducing a cooling fluid to the chamber, and
directing the cooling fluid to flow over a front side of the workpiece in a direction generally parallel thereto.

49. A method in accordance with claim 35, further comprising the step of varying the pressure difference between the front side and backside of the workpiece.

50. A method in accordance with claim 35, further comprising the step of optimizing the cooling rate of the workpiece by varying the pressure difference between the front side and backside of the workpiece.

51. A method in accordance with claim 35, further comprising the step of varying the cooling efficiency by optimizing the pressure difference between the front side and backside of the workpiece.

52. A method in accordance with claim 35, wherein the step of positioning the workpiece defines a gap between the workpiece and the cooling surface when positioned to contact each other, the gap having a size in the range between about 0.1 microns and about 5 microns.

53. A method in accordance with claim 35, wherein the internal chamber has a pressure between about 35 Torr and about 760 Torr.

54. A method in accordance with claim 53, wherein applying a pressure from the cooling surface creates a pressure within the gap beneath the workpiece that draws the workpiece against the cooling surface, the gap pressure being in the range between about 20 Torr and about 745 Torr.

55. A method in accordance with claim 54, further comprising the step of varying the chamber pressure and the gap pressure such that the difference therebetween is between about 15 Torr and about 660 Torr.

56. A method in accordance with claim 55, wherein the gap pressure is between about 70 Torr and about 760 Torr.

57. A method in accordance with claim 55, wherein the pressure difference is between about 50 Torr and about 660 Torr.

58. A method in accordance with claim 55, wherein the gap has a size between about 0.1 microns and about 5 microns sufficient to allow the conductive transfer of heat between the workpiece and the cooling surface, the gap size being a function of one of the chamber pressure and the gap pressure.

59. A method in accordance with claim 35, wherein applying a pressure from the cooling surface creates a pressure within the gap beneath the workpiece that draws the workpiece against the cooling surface, the gap pressure being in the range between about 20 Torr and about 745 Torr.

60. A method in accordance with claim 35, wherein the chamber pressure is in the range between about 120 Torr and about 760 Torr.

61. A method in accordance with claim 35, wherein the cooling surface has a surface roughness of less than about 5 $\mu$m.

62. A method in accordance with claim 35, further comprising the step of disposing the chamber pressure to substantially above vacuum.

63. A system for cooling a treated workpiece, comprising
a process housing having a process chamber,
means fluidly coupled to the process chamber for treating the workpiece,
a loadlock housing having a loadlock chamber fluidly coupled to the process chamber, said loadlock chamber having a cooling surface disposed therein and being sized and dimensioned for receiving the treated workpiece, and
vacuum means coupled to the cooling surface for drawing the workpiece into relatively close proximity with the cooling surface and, thereby, effecting heat transfer from the workpiece to the cooling surface.

64. The system of claim 63, wherein said vacuum means applies a pressure to one side of the workpiece to effect cooling thereof.

65. The system of claim 64, wherein said vacuum means draws the workpiece into relatively close proximity with a cooling surface of the loadlock chamber to effect heat transfer between the workpiece and the cooling surface.

66. The system of claim 65, further comprising a pressure regulator to control the pressure within the chamber so as to define a gap between the workpiece and the cooling surface to ensure that the heat transfer between the cooling surface and the workpiece is predominantly conductive.

67. The system of claim 65, wherein said cooling means further comprises means for circulating a cooling fluid through the cooling surface.

68. The system of claim 67, further comprising a controller for automatically controlling the mechanical lift assembly.

69. The system of claim 65, wherein the cooling surface comprises a plurality of openings for allowing passage of a mechanical lift assembly through the loadlock housing and into the loadlock chamber.

70. The system of claim 65, wherein the mechanical lift assembly comprises a support bar and means for variably adjusting the position of the support bar within the loadlock chamber.

71. The system of claim 63, wherein said cooling of the workpiece is predominantly conductive cooling.

72. The system of claim 63, further comprising means for disposing the loadlock chamber at a selected pressure to create a force on the workpiece to disposed the workpiece in close proximity to a cooling surface within the loadlock chamber.

73. The system of claim 72, wherein the workpiece is positioned relative to the cooling surface to form a gap therebetween, and wherein the loadlock chamber is disposed at a pressure between about 35 Torr and about 760 Torr, and the gap beneath the workpiece is disposed at a pressure between about 20 Torr and about 745 Torr, thereby forming a net force on the workpiece that draws the workpiece toward the cooling surface.

* * * * *